United States Patent
O'Brien

(10) Patent No.: US 7,904,854 B2
(45) Date of Patent: Mar. 8, 2011

(54) SYSTEM AND METHOD FOR CHECKING FOR SUB-RESOLUTION ASSIST FEATURES

(75) Inventor: Sean C. O'Brien, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 105 days.

(21) Appl. No.: 11/498,834

(22) Filed: Aug. 4, 2006

(65) Prior Publication Data
US 2008/0034343 A1 Feb. 7, 2008

(51) Int. Cl.
*G06F 17/50* (2006.01)
(52) U.S. Cl. .............................. 716/53; 716/54
(58) Field of Classification Search ................ 716/4, 19, 716/2, 5, 11, 53, 54
See application file for complete search history.

(56) References Cited

U.S. PATENT DOCUMENTS

| | | | |
|---|---|---|---|
| 2003/0208742 A1* | 11/2003 | LaCour | 716/21 |
| 2004/0078763 A1* | 4/2004 | Lippincott | 716/2 |
| 2004/0209169 A1* | 10/2004 | Cui et al. | 430/5 |
| 2005/0097501 A1* | 5/2005 | Cobb et al. | 716/21 |
| 2005/0202321 A1* | 9/2005 | Gordon et al. | 430/5 |
| 2005/0208396 A1* | 9/2005 | Lippincott | 430/30 |
| 2006/0166110 A1* | 7/2006 | Melvin et al. | 430/5 |

* cited by examiner

*Primary Examiner* — Sun J Lin
*Assistant Examiner* — Suresh Memula
(74) *Attorney, Agent, or Firm* — Warren L. Franz; Wade J. Brady, III; Frederick J. Telecky, Jr.

(57) ABSTRACT

In accordance with the invention, there is provided a system and method for checking a mask layout including sub-resolution assist features (SRAFs). A checking program divides each edge of each main feature into sections, forms a set of segments by searching perpendicularly over a distance to determine if any portion of a feature is located within the distance. Segments are then flagged based on whether a feature located within proximity to that segment. A classification program may then classify each of the main features based on the segment data.

6 Claims, 2 Drawing Sheets

SYSTEM AND METHOD FOR CHECKING FOR SUB-RESOLUTION ASSIST FEATURES

FIELD OF THE INVENTION

This invention relates generally to semiconductor fabrication, and more particularly to a system and method for checking for sub-resolution assist features (SRAFs) in a mask layout.

BACKGROUND OF THE INVENTION

Semiconductor device fabrication frequently involves patterning features through the use of a mask and photo-sensitive material. A reticle is used to print images onto a mask, which is used to form patterns on the photo-sensitive material. Some reticles, called dark field reticles, are mainly chrome with features that are opened up where light is transmitted. Other reticles, called bright field reticles, are mainly glass with features defined by pieces of chrome.

Due to constraints in the lithographic process, the pattern formed in the photo-sensitive material does not coincide exactly with the mask pattern. Conventional masks often compensate for this phenomenon including features that differ somewhat from the features desired to be patterned in the photo-sensitive material.

For example, isolated main features will almost always print at a feature size significantly different from the same mask feature surrounded by other features. This is known as iso-dense bias. A main feature is a location on the reticle where a permanent feature should be printed and etched on a mask that corresponds as closely as possible to the original feature drawn by the designer. A main feature is typically a type of polygon.

To correct iso-dense bias, sub-resolution assist features (SRAFs), also known as scattering bars, are added to the mask. The SRAFs are in the shape of a polygon and are designed to make an isolated feature seem denser, and therefore, allow the isolated feature to print at the same feature size as a dense feature. An SRAF can be both positive and negative tone on the reticle. For example, on a bright field reticle, an SRAF can be defined by a piece of chrome and also by glass; when a piece of chrome defines a main feature, a glass opening can be cut into that chrome to define an SRAF.

The SRAF is a sub-resolution feature and, therefore, is not meant to print. It is carefully adjusted in size so that it never prints over the needed process window. Thus, SRAFs are designed to make the assist features as large as possible to create a denser mask pattern, but not so large as to print.

After adding SRAFs, optical proximity correction (OPC) is typically run-on the mask layout before the mask is fabricated. OPC is the process of modifying the polygons on the mask pattern to compensate for the non-ideal properties of the lithography process. If SRAFs are not positioned properly to eliminate iso-dense bias after OPC has been run, the pattern formed in the photo-sensitive material will not correctly correspond to the pattern in the mask.

Accordingly, it is desirable to provide systems and methods for checking the mask layout to determine if the SRAFs have been positioned and sized properly to eliminate iso-dense bias.

SUMMARY OF THE INVENTION

In accordance with various embodiments of the present teachings, there is provided a method of checking a mask layout where the mask layout includes a set of main features and a set of sub-resolution assist features (SRAFs). The exemplary method can include dividing each edge of each main feature into a set of sections. A set of segments can be formed by searching away from each one of the set of sections over a distance to determine if any portion of a feature is located within the distance. Each unassisted segment that does not include any portion of a feature located within the distance can be flagged. Segment data comprising the set of flagged segments for each of the set of main features can then be stored.

In accordance with various other embodiments of the present teachings, there is provided a system for checking a mask layout including a set of main features and a set of sub-resolution assist features (SRAFs). The exemplary system can include a central processing unit. The exemplary system can further include a checking program configured for execution by the central processing unit comprising program instructions for dividing each edge of each main feature into a set of sections, forming a set of segments by searching away from each one of the set of sections over a distance to determine if any portion of a feature is located within the distance, flagging each unassisted segment that does not include any portion of a feature located within the segment; and storing segment data comprising the set of flagged segments for each of the set of main features.

In accordance with still other embodiments of the present teachings, there is provided computer program product for use in conjunction with a computer system. The exemplary computer program product can include a computer readable storage medium and a computer program mechanism embedded therein, the computer program mechanism including a checking program configured for execution by the central processing unit including program instructions for dividing each edge of each main feature into a set of sections, forming a set of segments by searching each one of the set of sections over a distance to determine if any portion of a feature is located within the distance, flagging each unassisted segment that does not include any portion of a feature located within the segment; and storing segment data comprising the set of flagged segments for each of the set of main features Additional features of the invention will be set forth in part in the description which follows, and in part will be obvious from the description, or may be learned by practice of the invention. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and together with the description, serve to explain the principles of the invention.

DESCRIPTION OF THE EMBODIMENTS

Embodiments of the present invention provide a segment checker for sub-resolution assist features (SRAFs). In particular, each main feature edge on a mask is divided into sections. A search over a given distance is then performed perpendicular from each section to form a segment. If no other mask features are found from a segment, then that segment is classified as an unassisted segment. The feature is then classified by the number of unassisted segments and assigned a pass/fail level.

Reference will now be made in detail to the exemplary embodiments of the invention, examples of which are illustrated in the accompanying drawings. Wherever possible, the same reference numbers will be used throughout the drawings to refer to the same or like parts.

Figure 1:
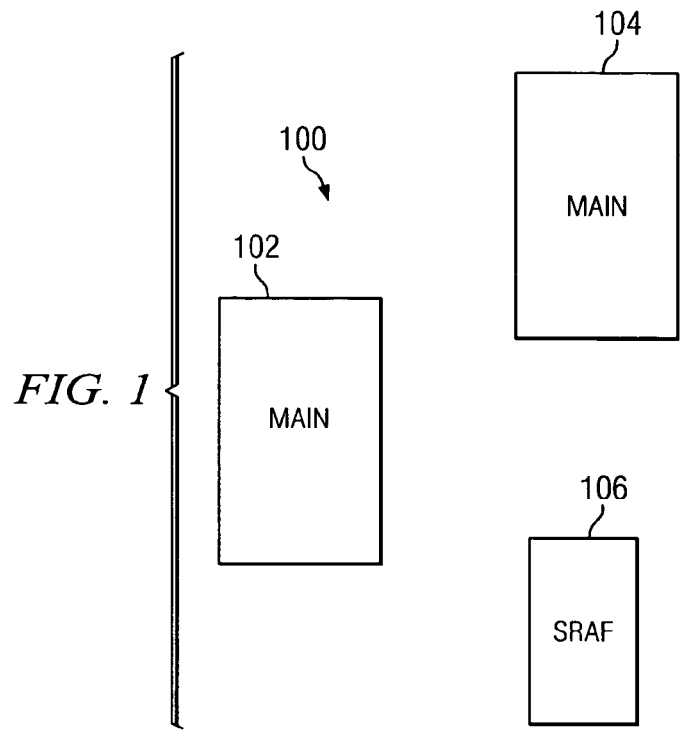
FIG. 1 depicts a block diagram of an exemplary mask layout, in accordance with systems and methods consistent with the present invention.

FIG. 1 depicts a block diagram of an exemplary mask layout, in accordance with systems and methods consistent with the present invention. Mask 100 is used to pattern a feature in photosensitive material (such as photoresist) for later formation of a portion of a semiconductor device. Mask 100, in one embodiment, is a mask layout after SRAFs have been added but before OPC has been run. In this embodiment, certain features of the mask layout, such as the contacts, are first upward biased in size so that those features closely match a post-OPC mask layout. This allows the present invention to be run on a mask layout that most closely matches the post-OPC mask layout. In alternative embodiments, the present invention is run on a mask layout after OPC has been run. But because SRAFs cannot be changed after OPC has been run, it may be preferable to run the present invention on a mask layout before OPC has been run.

Mask 100 includes a pair of main features 102 and 104 and a SRAF 106 disposed in proximity to main features 102 and 104. SRAF 106 is sub-resolution, meaning it will not print on the photo-sensitive material in the lithography process utilized with mask pattern 100. Features 102, 104, and 106 may be formed on a substrate, such as glass or other suitable substrate. Conventional materials for features 102, 104, and 106 include chrome formed on a glass substrate and glass features opened in a field of chrome; however any type of suitable mask materials may be utilized.

Figure 2:
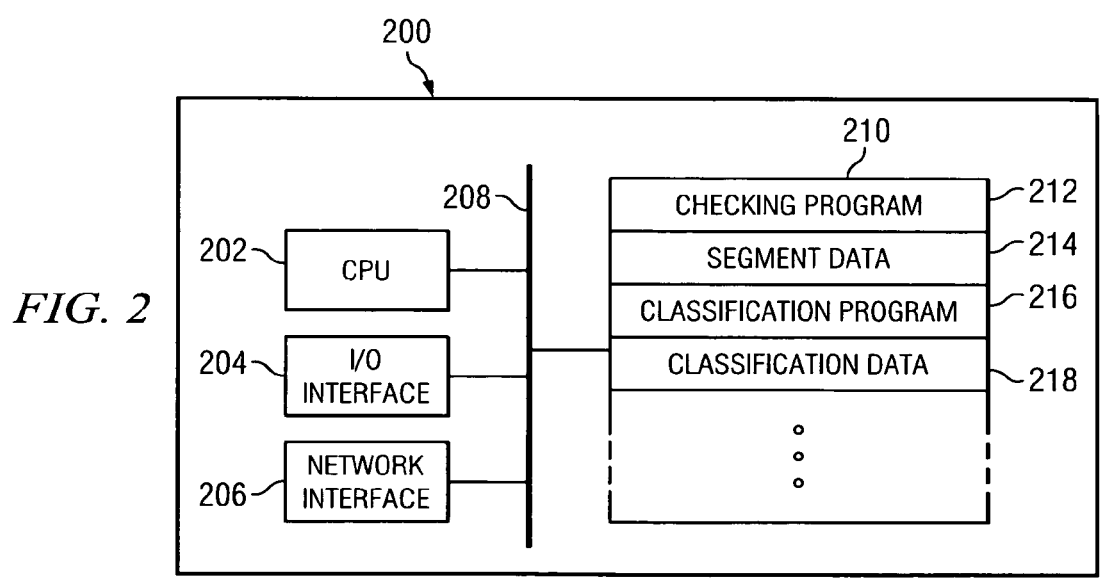
FIG. 2 depicts a block diagram of an exemplary system for checking a mask layout for the placement of SRAFs, in accordance with systems and methods consistent with the present invention.

FIG. 2 depicts a block diagram of an exemplary system for checking a mask layout for the placement of SRAFs, in accordance with systems and methods consistent with the present invention. System 200 may be embodied as a data processor, such as a computer, that functions to check the placement of SRAFs in a mask layout. System 200 includes at least one central processing unit (CPU) 202, an I/O interface 204, a network interface 206, and memory 210. CPU 202 executes instructions associated with the applications contained in memory 210 and transmits results to other subsystems in system 200 over a high speed interconnect or data bus 208. I/O interface 204 is an interface used to couple system 200 with devices such as a keyboard, a mouse, a display device, and any other I/O device useful in operating and managing system 200 as is understood by one of skill in the art. Network interface 206 is used to communicate with a network such as, for example, an intranet or the Internet (not shown).

Memory 210 includes in one embodiment: a checking program 212 having program instructions that when executed divide each edge of each main feature into sections, forms a set of segments by searching perpendicularly away from each section, and determines segment data 214; and a classification program 216 having program instructions that when executed classify features based on segment data 214 to determine classification data 218.

Figure 3:
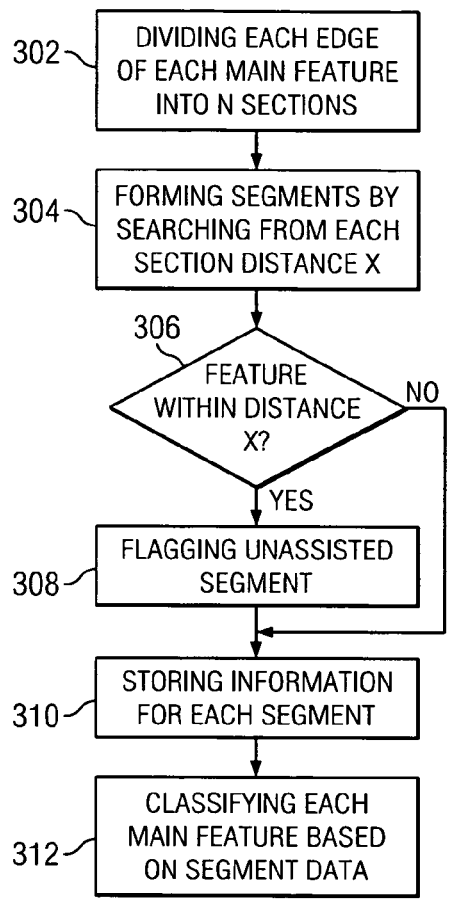
FIG. 3 depicts a flow diagram of an exemplary process for checking a mask layout for the placement of SRAFs and classifying the main features accordingly, in accordance with systems and methods consistent with the present invention.

FIG. 3 depicts a flow diagram of an exemplary process for checking a mask layout for the placement of SRAFs and classifying the main features accordingly, in accordance with systems and methods consistent with the present invention. The flow diagram will be described with reference to the embodiment of the system depicted in FIG. 2.

First, checking program 212 divides (step 302) each edge of each main feature into n sections. For example, checking program 212 may divide the edge of a main feature into equal length sections of approximately 15 nm. As another example, checking program 212 may simply measure the length of a main feature edge and divide into to a predetermined number of sections. Of course, checking program 212 may use sections of variable length depending on the shape and configuration of an edge of a main feature.

Figure 4:
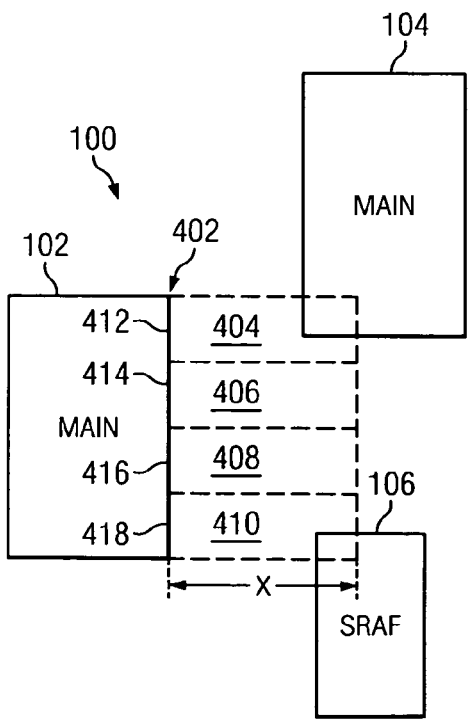
FIG. 4 depicts a block diagram of an exemplary embodiment of mask 100 in which right edge 402 of main feature 102 is divided into 4 sections of equal length, in accordance with systems and methods consistent with the present invention.

FIG. 4 depicts a block diagram of an exemplary embodiment of mask 100 in which right edge 402 of main feature 102 is divided into 4 sections of equal length, in accordance with systems and methods consistent with the present invention. As shown, checking program 210 divides right edge 402 into 4 sections, 412, 414, 416, 418.

Returning to the flow diagram of FIG. 3, checking program 210 searches (step 304) each section perpendicularly to determine if any portion of a feature is located within a threshold or spec distance, e.g., a distance X (step 306). A segment refers to the rectangular region formed by searching perpendicularly away from each section of right edge 402 over a distance X. Segment 404 is formed from section 412, segment 406 is formed from section 414, segment 408 is formed from section 416, and segment 410 is formed from section 418. In one embodiment, distance X is the maximum distance possible to a single centered shared SRAF. A single centered shared SRAF refers to an SRAF placed halfway between two features that satisfy certain separation criteria.

For example, referring again to FIG. 4, checking program 210 searches segments 404, 406, 408, 410 to determine if any portion of a feature is located within each segment. As shown in FIG. 4, main feature 104 is located within segment 404 and SRAF 106 is located within segment 410.

Referring to the flow diagram of FIG. 3, in step 308, checking program 210 will flag each segment based on its search. For example, if checking program 210 detects a feature within a segment (such as main feature 104 or SRAF 106), the segment is assisted. If checking program 210 does not detect a feature within a segment, the segment is unassisted.

Checking program 210 then stores (step 310) all the information for each segment in segment data 212. Segment data 212 includes the flagging information corresponding to each main feature and provides a risk priority profile based on the number of segments that are within proximity to another main feature and/or the number of consecutive number of flagged segments. Of course, other criteria and algorithms may be used to determine the risk priority profile of a main feature based, on segment data 212.

For example, referring again to FIG. 4, main feature 104 is located within segment 404 and SRAF 106 is located within segment 410. Accordingly, checking program 210 flags segments 404 and 410 as assisted segments and segments 406 and 408 as unassisted. Checking program 210 stores this information in segment data 212.

Returning to the flow diagram of FIG. 3, once checking program 210 has stored segment data 212 for each main feature, classification program 214 can classify (step 312) each main feature based upon segment data 212. For example, classification program 214 can classify each main feature based on the number of flagged segments it touches (i.e., segments that are within the spec distance), the number of consecutive flagged segments it touches, and/or any other criteria that may be determined from segment data 212.

In one embodiment, classification program 214 can assign a pass/fail level such that certain main features will "pass" based on the chosen criteria, while other main features will "fail" based on the chosen criteria. For example, if a main feature touches fewer than 8 flagged segments, the feature may be failed. However, if a main feature touches more than 8 flagged segments it may be passed. Classification program 214 can then store the information related to the classification of the main features in classification information 216.

Classification program 214 can then provide classification information 216 to a user or set of users through user interface 204 or network interface 206. In one embodiment classification program 214 can provide classification information 216 to a layout program (not shown) for automatically re-arranging the SRAFs on the mask.

The present invention can be implemented as a computer program product that includes a computer program mechanism embedded in a computer readable storage medium. For instance, the computer program product could contain the program modules shown in FIG. 2. These program modules may be stored on a CD-ROM, magnetic disk storage product, or any other computer readable data or program storage product. The software modules in the computer program product may also be distributed electronically, via the Internet or otherwise, by transmission of a computer data signal (in which the software modules are embedded) on a carrier wave.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A process for preparing a photolithography mask usable in the fabrication of a semiconductor device for printing isolated and dense design features onto a photosensitive layer formed over a substrate, comprising:
    providing a proposed mask layout having a set of main features corresponding to the design features and a set of sub-resolution assist features (SRAFs) added to correct iso-dense bias in the printing of the main features;
    checking the proposed mask layout to determine if the set of SRAFs have been positioned properly to correct the iso-dense bias, including:
        dividing each edge of each main feature in the set of main features into a set of sections;
        forming a set of segments by searching away from each one of the set of sections over a threshold distance perpendicular to the edge, to determine if any portion of a main or sub-resolution assist feature is located within the threshold distance, wherein the threshold distance is a given maximum permissible distance to a single centered shared SRAF shared by the main feature and another main feature in the set of main features;
        flagging each segment that does not include any portion of a main or sub-resolution assist feature located within the threshold distance;
        storing segment data comprising the set of flagged segments for each main feature in the set of main features; and
        classifying each main feature and assigning a pass/fail level based on the number of flagged segments; and
    revising the mask layout by automatically rearranging the sub-resolution assist features based on the assigned pass/fail levels.

2. The method of claim 1, wherein each section is of equal length for each edge.

3. The method of claim 1, wherein each section is of variable length for each edge.

4. The method of claim 1, wherein at least the dividing, segment set forming, and flagging steps are done prior to running optical proximity correction (OPC) on the mask layout.

5. The method of claim 1, further comprising running optical proximity correction (OPC) on the mask layout after rearranging the sub-resolution assist features.

6. A method of fabricating a semiconductor device, comprising:
    preparing a photolithography mask, including:
        providing a proposed mask layout having a set of main features corresponding to isolated and dense design features and a set of sub-resolution assist features (SRAFs) added to correct iso-dense bias in the printing of the main features;
        checking the proposed mask layout to determine if the set of SRAFs have been positioned properly to correct the iso-dense bias, including:
            dividing each edge of each main feature in the set of main features into a set of sections;
            forming a set of segments by searching away from each one of the set of sections over a threshold distance perpendicular to the edge, to determine if any portion of a main or sub-resolution assist feature is located within the threshold distance, wherein the threshold distance is a given maximum permissible distance to a single centered shared SRAF shared by the main feature and another main feature in the set of main features;
            flagging each segment that does not include any portion of a main or sub-resolution assist feature located within the threshold distance;
            storing segment data comprising the set of flagged segments for each main feature in the set of main features; and
            classifying each main feature and assigning a pass/fail level based on the number of flagged segments;
        revising the mask layout by automatically rearranging the sub-resolution assist features based on the assigned pass/fail levels;
    forming a photosensitive layer over a substrate; and
    printing the isolated and dense design features onto the photosensitive layer using the revised mask layout.

* * * * *